United States Patent
Saji et al.

(10) Patent No.: US 9,451,690 B2
(45) Date of Patent: Sep. 20, 2016

(54) HIGH FREQUENCY CIRCUIT MODULE

(71) Applicant: TAIYO YUDEN CO., LTD., Tokyo (JP)

(72) Inventors: Tetsuo Saji, Tokyo (JP); Hiroshi Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 84 days.

(21) Appl. No.: 13/869,335

(22) Filed: Apr. 24, 2013

(65) Prior Publication Data
US 2014/0133117 A1 May 15, 2014

(30) Foreign Application Priority Data

Nov. 12, 2012 (JP) .................................. 2012-248255

(51) Int. Cl.
*H05K 1/18* (2006.01)
*H05K 1/02* (2006.01)
*H01L 23/00* (2006.01)

(52) U.S. Cl.
CPC ............ *H05K 1/0243* (2013.01); *H01L 24/24* (2013.01); *H01L 2223/6677* (2013.01); *H01L 2224/04105* (2013.01); *H01L 2224/16225* (2013.01); *H01L 2224/73267* (2013.01); *H01L 2924/19105* (2013.01); *H05K 1/0233* (2013.01); *H05K 1/0253* (2013.01); *H05K 1/185* (2013.01)

(58) Field of Classification Search
CPC .................................................. H05K 1/0237
USPC ........ 174/260, 255, 261, 262, 266; 361/760, 361/761, 803, 780, 792, 793, 794, 795
See application file for complete search history.

(56) References Cited

U.S. PATENT DOCUMENTS

| | | | | |
|---|---|---|---|---|
| 6,323,439 | B1* | 11/2001 | Kambe et al. | 174/262 |
| 6,818,979 | B2* | 11/2004 | Takehara et al. | 257/687 |
| 2003/0128522 | A1* | 7/2003 | Takeda et al. | 361/715 |
| 2006/0276158 | A1* | 12/2006 | Okabe | 455/333 |
| 2008/0186247 | A1* | 8/2008 | Cotte et al. | 343/841 |
| 2009/0084596 | A1* | 4/2009 | Inoue et al. | 174/261 |
| 2011/0203836 | A1* | 8/2011 | Yokota et al. | 174/250 |
| 2012/0038411 | A1 | 2/2012 | Sugiura et al. | |
| 2013/0003314 | A1* | 1/2013 | Igarashi et al. | 361/719 |

FOREIGN PATENT DOCUMENTS

| | | |
|---|---|---|
| JP | 2004-312543 A | 11/2004 |
| JP | 2004-357037 A | 12/2004 |
| JP | 2012-39020 A | 2/2012 |

\* cited by examiner

*Primary Examiner* — Yuriy Semenenko
(74) *Attorney, Agent, or Firm* — Chen Yoshimura LLP (57) ABSTRACT

A multilayer circuit substrate has a high frequency switch embedded therein. In the multilayer circuit substrate, a first conductive layer that faces a main surface of the high frequency switch through an insulating layer has circuit patterns formed therein so as to be connected to input/output terminals through via conductors. The first conductive layer has an opening pattern in which a ground conductor is not present in a region that faces the main surface of the high frequency switch and that is outside of the circuit patterns. In a third conductive layer disposed outer side of the first conductive layer with respect to the high frequency switch, a ground conductor is formed at least in a region where the main surface of the high frequency switch is projected in the thickness direction.

7 Claims, 4 Drawing Sheets

HIGH FREQUENCY CIRCUIT MODULE

This application claims the benefit of Japanese Application No. 2012-248255, filed in Japan on Nov. 12, 2012, which is hereby incorporated by reference in its entirety.

BACKGROUND OF THE INVENTION

1. Field of the Invention

The present invention relates to a high frequency circuit module in which a high frequency circuit is mounted on a multilayer circuit substrate, and more particularly, to an installation structure of a high frequency switch that switches connection between an antenna and a high frequency circuit.

2. Description of Related Art

Conventionally, in circuit modules including high frequency switches used for mobile phones, switching circuits utilizing PIN diodes have been employed. However, with a recent trend for capabilities of handling multiple bands and higher communication frequency band, high frequency switches utilizing FET switches have been more widely used. Known examples of circuit modules with this type of high frequency switches include circuit modules disclosed in Patent Documents 1 to 3. Patent Document 1 discloses a high frequency switch module in which a high frequency switch IC is mounted on a surface of a multilayer circuit substrate. Patent Document 2 discloses a high frequency module in which a GaAs switch element is mounted on a surface of a multilayer substrate. Patent Document 3 discloses a high frequency switch module in which a high frequency switch element is mounted on a surface of a laminated body by wire bonding.

RELATED ART DOCUMENTS

Patent Documents

Patent Document 1: Japanese Patent Application Laid-Open Publication No. 2012-39020
Patent Document 2: Japanese Patent Application Laid-Open Publication No. 2004-312543
Patent Document 3: Japanese Patent Application Laid-Open Publication No. 2004-357037

SUMMARY OF THE INVENTION

Recently, in this type of high frequency circuit modules, demands for further size reduction and thickness reduction are increasing. However, with conventional configurations of a high frequency circuit module, due to a problem of characteristics degradation caused by interference between signal lines or a stray capacitance between a signal line and a ground pattern, the further size reduction and thickness reduction were not possible. To address this issue, development of a configuration in which a high frequency switch is embedded in a circuit substrate has been underway. However, in the configurations disclosed in Patent Documents 1 to 3 above, it was difficult to achieve sufficient size reduction and thickness reduction by merely embedding a high frequency switch in a circuit substrate.

For example, in the configuration disclosed in Patent Document 1 above in which a ground layer PG is disposed under a high frequency switch IC to prevent interference between the high frequency switch IC and a signal line in a lower layer, if the structure of embedding the component in the substrate was adopted, and a ground was disposed in a layer near a function surface of the high frequency switch IC, the characteristic degradation occurred due to a stray capacitance between the two. Also, in the configuration of Patent Document 1 above, ground wiring PG is disposed under the high frequency switch IC, but when the high frequency switch IC and the ground wiring are too close, the characteristic degradation would occur due to a stray capacitance between the two. In particular, when a component is embedded in the substrate, an insulating layer in an inner layer is made thinner, which makes the effect of the stray capacitance greater. In the configuration disclosed in Patent Document 2 above, a ground electrode 12 is disposed directly below a pad for mounting a GaAs switch element, but when the thickness of the substrate is reduced, a stray capacitance between the pad and the ground electrode becomes a problem. In the configuration disclosed in Patent Document 3 above, by disposing a bonding pad away from the ground below, a stray capacitance is reduced, but because a bonding wire is needed, if a high frequency switch element is to be embedded inside, it would be difficult to reduce the thickness.

As described above, the conventional configurations disclosed in Patent Documents 1 to 3 were designed to mount a high frequency switch on a surface of the circuit substrate, and therefore, it was not possible to solve the problem of characteristic degradation (in particular, the problem of stray capacitance occurring in the high frequency switch and the periphery thereof) or it was difficult to achieve size reduction and thickness reduction, by merely embedding the high frequency switch inside the circuit substrate. In other words, for embedding a high frequency switch in a circuit substrate to achieve size reduction and thickness reduction, a specific design concept suitable for the structure is necessary.

The present invention was made in view of the above situations, and an object thereof is to provide a high frequency circuit module that has excellent high frequency characteristics and that can achieve size reduction with ease.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a high frequency circuit module that includes: a multilayer circuit substrate formed by alternately stacking insulating layers and conductive layers; and a high frequency switch having input/output terminals for high frequency signals formed on a main surface thereof, wherein the high frequency switch is embedded in the multilayer circuit substrate, wherein, in the multilayer circuit substrate, a first conductive layer that faces the main surface of the high frequency switch through an insulating layer, the first conductive layer having circuit patterns connected to the input/output terminals through via conductors, and wherein, in the multilayer circuit substrate, at least one second conductive layer is disposed to face the first conductive layer through an insulating layer, the second conductive layer being patterned to have an opening in which a conductor is not present, such that the patterned second conductive layer does not overlap the input/output terminals of the high frequency switch in a plan view.

According to the present invention, because the high frequency switch is embedded in the multilayer circuit substrate, the high frequency circuit module can be made smaller. One or more second conductive layers that face the first conductive layer through an insulating layer have a part in which a conductor is not formed in a region that is facing at least the main surface and that is near the input/output terminals of the high frequency switch. This makes it possible to minimize a stray capacitance between the input/output terminals of the high frequency switch and the second conductive layer. That is, according to the present invention, the size reduction can be achieved while preventing the characteristic degradation due to a stray capacitance.

In a preferred embodiment of the present invention, in the multilayer circuit substrate, a third conductive layer is disposed on an outer side of the second conductive layer with respect to the high frequency switch, and a ground conductor is formed so as to cover at least the input/output terminals of the high frequency switch in a plan view. According to the present invention, because the ground conductor is formed in the third conductive layer, noise from other electronic components on the high frequency circuit module or from the outside can be prevented from entering the high frequency switch.

In a preferred embodiment of the present invention, the first conductive layer is patterned to have an opening in which a conductor is not present, such that the patterned first conductive layer does not overlap the main surface of the high frequency switch, the opening being located in a portion of the first conductive layer where the circuit patterns are not formed. According to the present invention, it is possible to minimize a stray capacitance between the high frequency switch and the first conductive layer.

In another preferred embodiment of the present invention, in the first conductive layer, the circuit patterns connected to the input/output terminals are extended from the respective via conductors in a direction away from a region of the first conductive layer that faces the main surface of the high frequency switch in a plan view. According to the present invention, it is possible to minimize a stray capacitance between the circuit patterns connected to the input/output terminals of the high frequency switch and the high frequency switch. This makes it possible to prevent the characteristic degradation due to a stray capacitance even more reliably.

In another preferred embodiment of the present invention, the multilayer circuit substrate has an electronic component mounted on a first main surface thereof that faces in a same direction as the main surface of the high frequency switch, a terminal electrode of the high frequency circuit module is formed on a second main surface of the multilayer circuit substrate that is opposite to the first main surface, and the multilayer circuit substrate has a matching circuit mounted on the first main surface, the matching circuit being interposed between an antenna and the high frequency switch. According to the present invention, even when desired characteristics cannot be obtained due to variations in the high frequency switch, an installation state of the high frequency switch, or the like, because the matching circuit is mounted on the multilayer circuit substrate, it is possible to obtain desired characteristics with ease by replacing or adjusting the matching circuit. Also, because the distance between the matching circuit and the high frequency switch can be made shorter, a loss in high frequency signals can be reduced.

In another preferred embodiment of the present invention, the input/output terminals of the high frequency switch include an antenna terminal connected to an antenna and a plurality of circuit terminals connected to the high frequency circuit, and frequency bands of high frequency signals that pass through the respective circuit terminals are separated from each other over a prescribed frequency range between respective adjacent circuit terminals. According to the present invention, even when high frequency signals that pass through adjacent circuit terminals are coupled with each other, because the frequency bands thereof to be transmitted or received largely differ from each other, it is possible to prevent loop interference of the signals.

In another preferred embodiment of the present invention, the multilayer circuit substrate includes a core layer as a conductive layer that is thicker than other conductive layers and that functions as a ground, and the high frequency switch is stored in a penetrating hole or a recess formed in the core layer.

As described above, with the multilayer circuit substrate of the present invention, it is possible to achieve a size reduction while preventing characteristic degradation due to a stray capacitance.

DETAILED DESCRIPTION OF THE PREFERRED EMBODIMENTS

Figure 1:
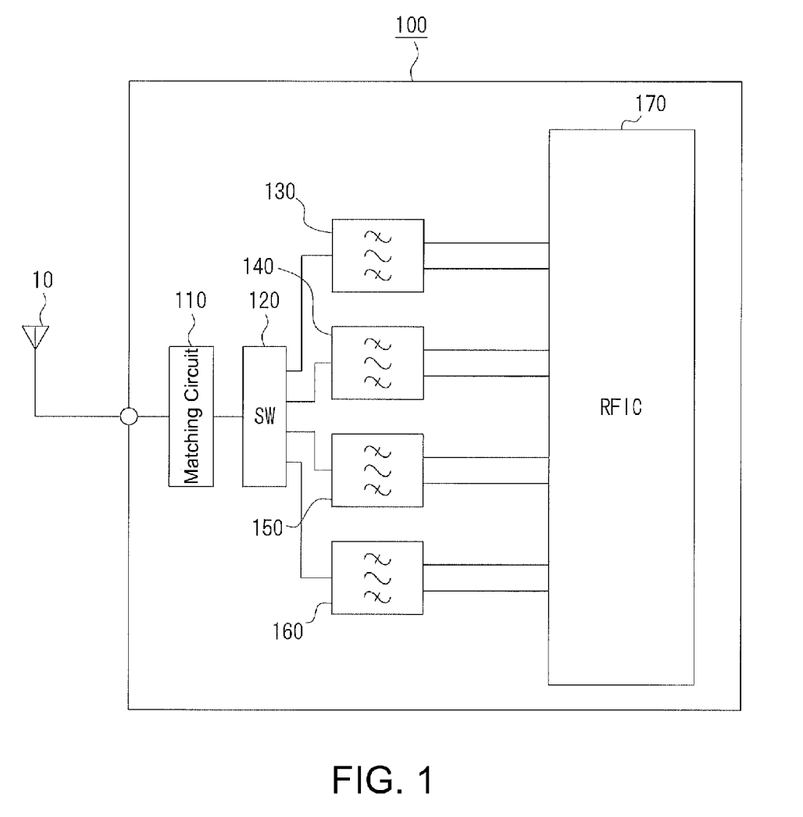
FIG. 1 is a schematic circuit diagram of a high frequency circuit module.

A high frequency circuit module according to Embodiment 1 of the present invention will be explained with reference to figures. FIG. 1 is a schematic circuit diagram of the high frequency circuit module. In the present embodiment, for ease of explanation, main configurations relating to the gist of the present invention will be explained.

A high frequency circuit module 100 of the present embodiment is used for a mobile phone that handles four frequency bands. The high frequency circuit module 100 has a diversity configuration, and includes a pair of transmission/reception circuits for one antenna, and one reception circuit for another antenna. In the present embodiment, the reception circuit of the latter will be explained.

As shown in FIG. 1, the high frequency circuit module 100 includes a matching circuit 110 to eliminate a mismatch with the antenna, a high frequency switch 120 that switches connections of the antenna for the respective frequency bands, first to fourth filters 130, 140, 150, and 160 that filter high frequency signals of the respective frequency bands, and an RFIC (radio frequency integrated circuit) 170 that conducts processes for high frequency signals such as modulation, demodulation, and multiplexing. In the actual circuit configuration, matching circuits and the like are provided for the respective frequency bands, but they are omitted from the present embodiment for ease of explanation.

The high frequency switch 120 switches connections between one external antenna 10 and the first to fourth filters 130 to 160 through the matching circuit 110. The high frequency switch 120 is a component in which a switching element such as an FET and a control element that controls the switching element are placed in one package.

The respective filters 130 to 160 are individual components such as elastic wave filters. Examples of the elastic wave filters include SAW (surface acoustic wave) filters and BAW (bulk acoustic wave) filters. In the present embodiment, SAW filters with balanced output are used. The respective filters 130 to 160 are connected to reception ports of the RFIC 170.

As described above, the high frequency circuit module 100 of the present embodiment handles four frequency bands, and the filters 130 to 160 filter high frequency signals so as to allow only signals in a prescribed frequency band to pass through.

Specifically, the first filter 130 is provided for 2100 MHz W-CDMA (wideband code division multiple access) or LTE (long term evolution). That is, the first filter 130 is a bandpass filter for 2110-2170 MHz. The second filter 140 is provided for 1700/2100 MHz W-CDMA or LTE. That is, the second filter 140 is a bandpass filter for 2110-2155 MHz. The third filter 150 is provided for 850 MHz W-CDMA, LTE or GSM (global system for mobile communications). That is, the third filter 150 is a bandpass filter for 869-894 MHz. The fourth filter 160 is provided for 900 MHz W-CDMA, LTE, or GSM. That is, the fourth filter 160 is a bandpass filter for 925-960 MHz.

Next, a configuration of the high frequency circuit module 100 will be explained with reference to FIGS. 2A to 2D. FIGS. 2A to 2D show patterns of respective layers of a multilayer circuit substrate, illustrating main parts of the high frequency circuit module. FIG. 3 is a cross-sectional view of FIG. 2A along the arrow A.

As shown in FIGS. 2 and 3, in the high frequency circuit module 100, electronic components 111 such as an inductor and a capacitor constituting the matching circuit 110 and the RFIC 170 are mounted on the upper surface of the multilayer circuit substrate 200. On the other hand, the high frequency switch 120 and the first to fourth filters 130 to 160 are embedded in the multilayer circuit substrate 200.

The multilayer circuit substrate 200 is a multilayer substrate formed by alternately stacking insulating layers and conductive layers. As shown in FIG. 3, the multilayer circuit substrate 200 includes a core layer 210 that has excellent conductive properties and that is made of a metal to be relatively thick, a plurality of (four each in the present embodiment) insulating layers 221 to 224 and conductive layers 241 to 244 formed on one main surface (upper surface) of the core layer 210, and a plurality of (four each in the present embodiment) insulating layers 231 to 234 and conductive layers 251 to 254 formed on the other main surface (lower surface) of the core layer 210. The insulating layers 221 to 224, 231 to 234 and the conductive layers 241 to 244 and 251 to 254 are formed on the respective main surfaces of the core layer 210 by the build-up method. The respective insulating layers 221 to 224 and 231 to 234 are formed in the same thickness. The respective conductive layers 241 to 244 and 251 to 254 are formed in the same thickness. The conductive layers 244 and 254 correspond to respective surface layers of the multilayer circuit substrate 200. The conductive layer 244 corresponds to a part mounting surface of the high frequency circuit module, and a circuit pattern for transmitting high frequency signals, lands for mounting external components, inspection pads, and the like are formed therein. The conductive layer 254 corresponds to the bottom surface through which the high frequency circuit module is mounted on a main circuit substrate, and terminal electrodes, ground electrodes, and the like are formed therein. The terminal electrodes include an antenna terminal electrode 261 to be connected to the antenna, and the antenna terminal electrode 261 is connected to the matching circuit 110 mounted on the surface of the multilayer circuit substrate 200 via a through-hole 262.

The core layer 210 has penetrating holes 211 to store electronic components therein. In the penetrating holes 211, as described above, electronic components such as the high frequency switch 120 and the first to fourth filters 130 to 160 are stored. Therefore, it is preferable that the thickness of the core layer 210 be greater than the height of the electronic components stored therein and that the core layer 210 have a great bending strength. The core layer 210 is made of an electrically conductive material, and provided with a reference potential (ground). Therefore, broadly, the core layer 210 can be regarded as a conductive layer of the multilayer circuit substrate 200. In the present embodiment, the core layer 210 is made of a metal plate, which is specifically a metal plate made of a copper or copper alloy. Spaces around electronic components stored in the penetrating holes 211 are filled with an insulating material such as a resin that is formed integrally with the insulating layer 221 or 231.

Next, a structure for installing the high frequency switch 120 in the multilayer circuit substrate 200 will be explained. FIGS. 2A to 2D show the core layer 210 and the conductive layers 241 to 243 of the multilayer circuit substrate 200 in this order when viewed from the part mounting surface of the multilayer circuit substrate 200 (top side of FIG. 3). In FIGS. 2B to 2D, the position of the high frequency switch 120 is shown with a dotted line.

Figure 2A:
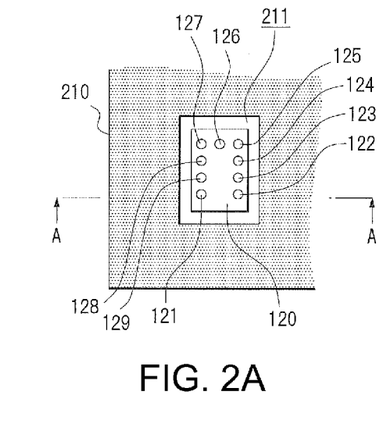
FIGS. 2A to 2D show patterns of respective layers of a multilayer circuit substrate, illustrating main parts of the high frequency circuit module.
Figure 2B:
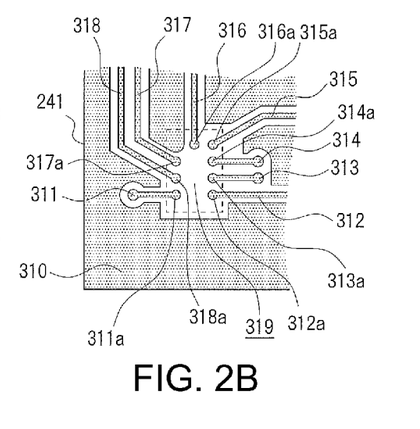
Figure 2C:
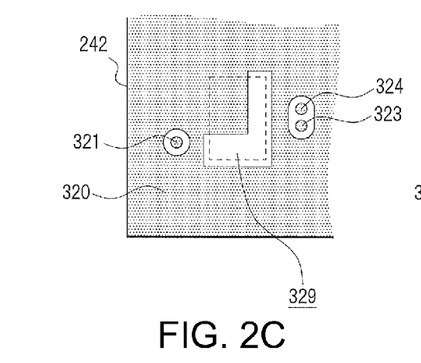
Figure 2D:
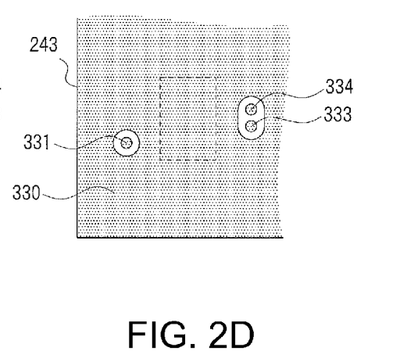
Figure 3:
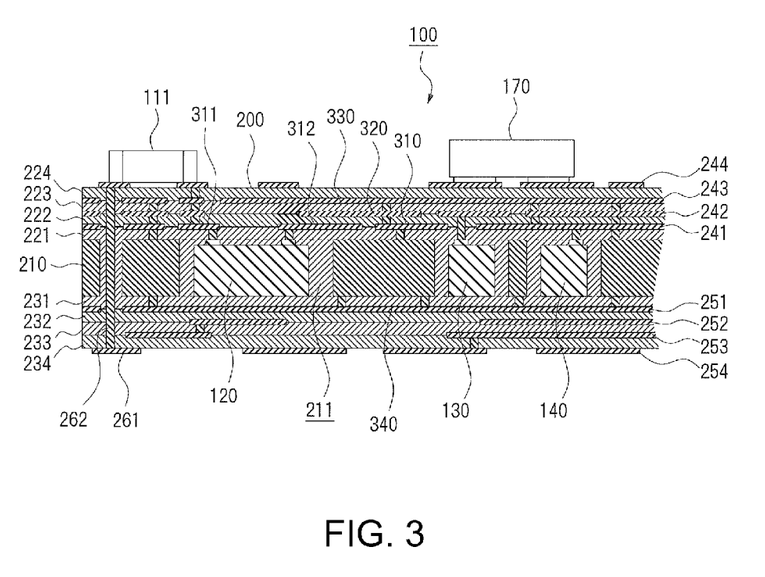
FIG. 3 is a cross-sectional view of a high frequency circuit module.
Figure 4A:
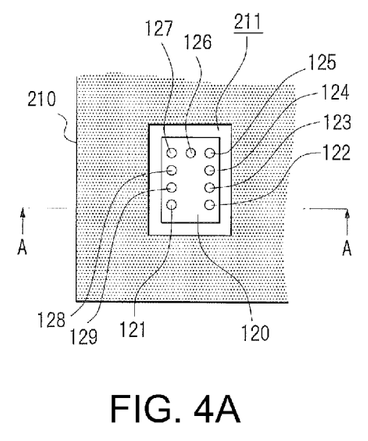
FIGS. 4A to 4D show patterns of respective layers of a multilayer circuit substrate, illustrating main parts of the high frequency circuit module according to another example.
Figure 4B:
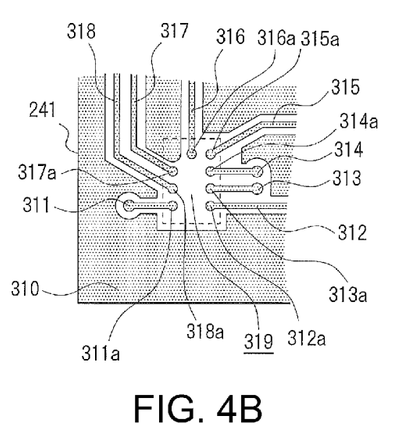
Figure 4C:
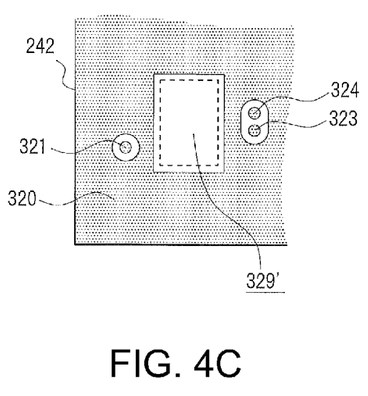
Figure 4D:
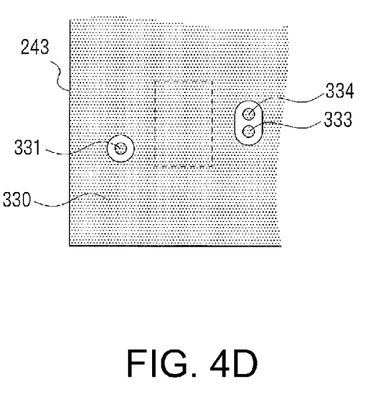

As shown in FIG. 2A, the high frequency switch 120 is placed in the penetrating hole 211 formed in the core layer 210 of the multilayer circuit substrate 200. On one main surface of the high frequency switch 120 (main surface closer to the part mounting surface of the multilayer circuit substrate 200), an antenna terminal 121 that is an input/output terminal to connect to the antenna, a plurality (four in the present embodiment) of circuit terminals 122 to 125 that are input/output terminals to connect to the high frequency circuit (the high frequency circuit includes the respective filters 130 to 160), a power terminal 126, a ground terminal 127, and one or more (two in the present embodiment) control terminals 128 and 129 are formed.

As shown in FIG. 2B, in the first conductive layer 241 that faces one main surface of the high frequency switch 120, circuit patterns 311 to 318 are formed so as to be connected to the antenna terminal 121, the circuit terminals 122 to 125, the power terminal 126, and the control terminals 128 and 129 through via conductors, respectively. At the ends of the circuit patterns 311 to 318, connecting lands 311a to 318a are formed, respectively, in a larger diameter than via conductors, and the connecting lands 311a to 318a are connected to the respective terminals of the high frequency switch 120 through via conductors. In the present invention, the circuit patterns 311 to 318 are extended in a direction that is further away from a region that faces the main surface of the high frequency switch 120, in other words, toward the outer side of the high frequency switch 120. In the entire first conductive layer 241, a ground conductor 310 that is a so-called "solid ground" is formed, having a prescribed distance from the circuit patterns 311 to 318. The ground terminal 127 of the high frequency switch 120 and the core layer 210 are connected to the ground conductor 310 through via conductors. Forming such a solid ground is a typical technique in a design of a high frequency circuit. On the other hand, in the high frequency switch 120, a path for high frequency signals is formed between the antenna terminal 121 and one of the circuit terminals 122 to 125. The region where such a path is formed is susceptible to an effect of a stray capacitance, and if a ground conductor and the like are formed nearby, characteristic degradation due to a stray capacitance is likely to occur. However, in the present invention, in a region facing the main surface of the high frequency switch 120, an opening pattern 319 is formed, instead of the ground conductor 310. This makes it possible to minimize a stray capacitance between the high frequency switch 120 and the ground conductor 310. Also, as described above, because the circuit patterns 311 to 318 are extended to be further away from the region facing the main surface of the high frequency switch 120, a stray capacitance between the high frequency switch 120 and the circuit patterns 311 to 318 can be minimized.

As shown in FIG. 2C, in the second conductive layer 242 that faces the first conductive layer 241, lands 321, 323, and 324 are formed so as to be connected to the circuit patterns 311, 313, and 314 of the first conductive layer 241 through via conductors. In the entire second conductive layer 242, a ground conductor 320 that is a so-called "solid ground" is formed, having a prescribed distance from the lands 321, 323, and 324. However, in the present invention, at least in a region where the antenna terminal 121 and the circuit terminals 122 to 125 of the high frequency switch 120, which are the input/output terminals for high frequency signals, are projected in the thickness direction, an opening pattern 329 in which the ground conductor 320 is not present is formed. It is preferable that the opening pattern 329 be formed so as to cover not only the projection region of the respective input/output terminals of the high frequency switch 120, but also a peripheral region thereof. Specifically, it is preferable to include at least a projection region of the connecting lands 311a to 318a from a perspective of reducing a stray capacitance. In the present embodiment, one L-shaped opening pattern 329 is formed along the arrangement pattern of the antenna terminal 121 and the circuit terminals 122 to 125. Therefore, in a region where the power terminal 126, the ground terminal 127, and the control terminals 128 and 129 are projected in the thickness direction, the ground conductor 320 is formed. As a result, it is possible to minimize a stray capacitance between the input/output terminals of the high frequency switch 120 and the ground conductor 320. The ground conductor 320 is connected to the ground conductor 310 through a via conductor.

As shown in FIG. 2D, in the third conductive layer 243 that faces the second conductive layer 242, lands 331, 333, and 334 are formed so as to be connected to the lands 321, 323, and 324 of the second conductive layer 242 through via conductors. In the entire third conductive layer 243, a ground conductor 330 that is a so-called "solid ground" is formed, having a prescribed distance from the lands 331, 333, and 334. The third conductive layer 243 differs from the second conductive layer 242 and the first conductive layer 241 in that an opening pattern is not formed therein. In a region where the main surface of the high frequency switch 120 is projected in the thickness direction, the ground conductor 330 is formed. This makes it possible to prevent noise from entering the high frequency switch 120. The ground conductor 330 is connected to the ground conductor 320 through a via conductor. As shown in FIG. 3, in the conductive layer 251 that faces the other main surface of the high frequency switch 120 (side mounted onto the main circuit substrate), a ground conductor 340 is formed. The ground conductor 340 is connected to the core layer 210 through via conductors.

Next, one of the features of the present invention will be explained with regard to a relationship between the installation structure of the high frequency switch 120 shown in FIGS. 2A to 2D and the circuit shown in FIG. 1. As shown in FIG. 2A, on the main surface of the high frequency switch 120, a plurality of circuit terminals 122 to 125 connected to the high frequency circuit are arranged side by side. One of the features of the present invention is that frequency bands of high frequency signals that pass through the respective circuit terminals 122 to 125 are separated from each other over a prescribed frequency range between respective adjacent circuit terminals. "Separated from each other over a prescribed frequency range" means that respective frequency bands are separated from each other sufficiently enough to prevent loop interference, which will be described below, and to ensure an electrical isolation.

In this example, it is assumed that the high frequency circuit module 100 conducts communications with 900 MHz W-CDMA, LTE, or GSM using the fourth filter 160 of FIG. 1. In the communications, the transmission frequency band is 880-915 MHz, and the reception frequency band is 925-960 MHz. Also, the high frequency switch 120 is controlled such that the antenna 10 is connected to the fourth filter 160. In this state, a transmission signal in 880-915 MHz is blocked by the fourth filter 160, and does not flow to the RFIC 170. However, in the high frequency switch 120, if the third filter 150 is disposed adjacent to the circuit terminal connected to the fourth filter 160, due to the coupling between the circuit terminals of the high frequency switch 120, it is possible that the transmission signal of 880-915 MHz flows into the third filter 150. Because the passband of the third filter 150 is 869-894 MHz, as a result of coupling with the fourth filter 160 or with a wiring line between the third filter 150 and the RFIC 170, the transmission signal can flow into the reception port for the 900 MHz band in the RFIC 170. In other words, the transmission signal enters the reception circuit.

In order to prevent such loop interference, in the present invention, frequency bands of high frequency signals that pass through the respective circuit terminals 122 to 125 are separated from each other over a prescribed frequency range between respective adjacent circuit terminals. Specifically, the frequency bands handled by the high frequency circuit module 100 may be divided into a plurality of (two, for example) groups depending on the levels of the frequency, and the circuit terminals 122 to 125 may be arranged such that respective adjacent terminals do not belong to the same group. The frequency bands at a prescribed frequency level (1 GHz, for example) and higher may be grouped as a higher range group, and the frequency bands lower than that may be grouped as a lower range group. As a result, the frequency bands can be separated from each other over at least a frequency range between these groups. In the present embodiment, the frequency bands are divided into groups using 1 GHz as a boundary, and the circuit terminal 122 is connected to the first filter 130, the circuit terminal 123 is connected to the third filter 150, the circuit terminal 124 is connected to the second filter 140, and the circuit terminal 125 is connected to the fourth filter 160.

As described above, in the high frequency circuit module 100 of the present embodiment, the high frequency switch 120 is embedded in the multilayer circuit substrate 200, and therefore, it is possible to achieve the size reduction. The first conductive layer 241 that faces the main surface of the high frequency switch 120 does not have the ground conductor 310 in at least a region thereof that faces the main surface. As a result, the stray capacitance between the high frequency switch 120 and the first conductive layer 241 can be minimized. On the other hand, in the third conductive layer 243 that is disposed in the outer side of the first conductive layer 241 with respect to the high frequency switch 120, the ground conductor 330 is formed at least in a region where the main surface of the high frequency switch 120 is projected in the thickness direction of the multilayer circuit substrate 200. As a result, noise from other electronic components on the high frequency circuit module 100 or from the outside can be prevented from entering the high frequency switch 120. That is, according to the present invention, the size reduction can be achieved while preventing the characteristic degradation due to a stray capacitance.

Also, in the high frequency circuit module 100 of the present embodiment, the circuit patterns 311 to 318 connected to the input/output terminals of the high frequency switch 120 are extended so as to be further away from the high frequency switch 120. Therefore, it is possible to minimize the stray capacitance between the respective circuit patterns 311 to 318 and the high frequency switch 120.

Further, in the high frequency circuit module 100 of the present embodiment, in the second conductive layer 242 between the first conductive layer 241 and the third conductive layer 243, the ground conductor 320 is not formed in a region where the main surface of the high frequency switch 120 is projected in the thickness direction. Therefore, it is possible to ensure a sufficient distance between the main surface of the high frequency switch 120 and the ground conductor 330 that faces the main surface. This makes it possible to reliably minimize a stray capacitance between the two. In particular, in the second conductive layer 242, the ground conductor 320 is not formed at least in a region where the antenna terminal 121 and the circuit terminals 122 to 125 of the high frequency switch 120, which are the input/output terminals for high frequency signals, are projected in the thickness direction. This makes it possible to reliably minimize the stray capacitance between the respective input/output terminals and the ground conductor.

Further, in the high frequency circuit module 100 of the present embodiment, the matching circuit 110 is mounted on the multilayer circuit substrate 200. Therefore, even when desired characteristics cannot be obtained due to variations in the high frequency switch 120, an installation state of the high frequency switch 120, or the like, it is possible to obtain desired characteristics with ease by replacing or adjusting the matching circuit 110. Also, because the distance between the matching circuit 110 and the high frequency switch 120 can be made shorter, a loss in high frequency signals can be reduced.

In the high frequency circuit module 100 of the present embodiment, the circuit terminals 122 to 125 of the high frequency switch 120 are arranged such that frequency bands of high frequency signals that pass through the respective circuit terminals 122 to 125 are separated from each other over a prescribed frequency range between respective adjacent circuit terminals. This makes it possible to prevent loop interference of the signal even when the high frequency signal is coupled with an adjacent circuit terminal.

One embodiment of the present invention was described above, but the present invention is not limited thereto. For example, in the embodiment above, the respective filters 130 to 160 were embedded in the multilayer circuit substrate 200, but it is also possible to mount them on the multilayer circuit substrate 200. In the embodiment above, the reception system of the diversity configuration was explained, but the present invention can also be used for a transmission/reception system.

In the embodiment above, the L-shaped opening pattern 329 in which the ground conductor 320 is not formed was formed in the second conductive layer 242 at least in a region where the antenna terminal 121 and the circuit terminals 122 to 125 of the high frequency switch 120, which are the input/output terminals for high frequency signals, are projected in the thickness direction. However, as shown in FIG. 4, an opening pattern 329' may be formed so as to cover the region that faces the main surface of the high frequency switch 120.

In the embodiment above, the respective insulating layers 221 to 224 and 231 to 234 were formed in the same thickness, and the respective conductive layers 241 to 244 and 251 to 254 were formed in the same thickness. However, the thickness of each layer may be appropriately changed.

In the embodiment above, the matching circuit 110 was interposed between the high frequency switch 120 and the antenna 10, but the matching circuit 110 does not have to be provided. The matching circuit 110 is not necessary if desired matching is ensured between the elements such as between the high frequency switch 120 and the antenna 10.

In the embodiment above, only the matching circuit 110 was interposed between the high frequency switch 120 and the antenna 10, but other circuit elements may be provided therebetween. For example, a high frequency coupler may be provided. In such a case, it is preferable to mount the high frequency coupler on the multilayer circuit substrate 200 and in or around the projection area of the high frequency switch 120 from the perspectives of size reduction and loss reduction.

In the embodiment above, the penetrating hole 211 was formed in the core layer 210, and the high frequency switch 120 was disposed in the penetrating hole 211. However, a recess may be formed in the core layer 210 instead of the penetrating hole 211, and the high frequency switch 120 may be disposed in the recess.

In the embodiment above, an example of forming the core layer 210 of copper or copper alloy was described, but there is no limitation on the material, and other metals, alloys, or resins can be used. The core layer 210 does not have to have electrical conductive properties. In the embodiment above, an example of providing the core layer 210 to the multilayer circuit substrate was described, but the multilayer circuit substrate does not have to have the core layer 210.

In the embodiment above, various components mounted on the upper surface of the multilayer circuit substrate 200 are exposed, but it is also possible to provide a case or to seal the multilayer circuit substrate 200 with a resin or the like so as to cover a part or all of the upper surface thereof.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A high frequency circuit module, comprising:
   a multilayer circuit substrate formed by alternately stacking insulating layers and conductive layers; and a high frequency switch having input/output terminals for high frequency signals formed on a main surface thereof, wherein the high frequency switch is embedded in the multilayer circuit substrate, wherein, in the multilayer circuit substrate, a first conductive layer is located above, and faces, the main surface of the high frequency switch through an insulating layer, the first conductive layer having circuit patterns connected to the input/output terminals through via conductors, and wherein, in the multilayer circuit substrate, at least one second conductive layer is disposed above, and faces, the first conductive layer through an insulating layer, the second conductive layer being patterned to have an opening in which a conductor is not present, such that the patterned second conductive layer overlaps a part of the high frequency switch in a plan view, but does not overlap the input/output terminals of the high frequency switch in the plan view, thereby mitigating stray capacitances between the input/output terminals and the second conductive layer.

2. The high frequency circuit module according to claim 1, wherein, in the multilayer circuit substrate, a third conductive layer is disposed on an outer side of the second conductive layer with respect to the high frequency switch, and a ground conductor is formed in the third conductive layer so as to cover at least the input/output terminals of the high frequency switch in a plan view.

3. The high frequency circuit module according to claim 1, wherein the first conductive layer is patterned to have an opening in which a conductor is not present, such that the patterned first conductive layer does not overlap the main surface of the high frequency switch, the opening being located in a portion of the first conductive layer where the circuit patterns are not formed.

4. The high frequency circuit module according to claim 1, wherein, in the first conductive layer, the circuit patterns connected to the input/output terminals are extended from the respective via conductors in a direction away from a region of the first conductive layer that faces the main surface of the high frequency switch in a plan view.

5. The high frequency circuit module according to claim 1, wherein, the multilayer circuit substrate has an electronic component mounted on a first main surface thereof that faces in a same direction as the main surface of the high frequency switch, wherein a terminal electrode of the high frequency circuit module is formed on a second main surface of the multilayer circuit substrate that is opposite to the first main surface, and wherein the multilayer circuit substrate has a matching circuit mounted on the first main surface, the matching circuit being interposed between an antenna and the high frequency switch.

6. The high frequency circuit module according to claim 1, wherein the input/output terminals of the high frequency switch include an antenna terminal connected to an antenna and a plurality of circuit terminals connected to a high frequency circuit, and wherein frequency bands of high frequency signals that pass through the circuit terminals are separated from each other over a prescribed frequency range between respective adjacent circuit terminals.

7. The high frequency circuit module according to claim 1, wherein the multilayer circuit substrate includes a core layer as a conductive layer, the core layer being thicker than other conductive layers and that functioning as a ground, and wherein the high frequency switch is stored in a penetrating hole or a recess formed in the core layer.

* * * * *